(12) United States Patent
Victor

(10) Patent No.: US 6,701,467 B1
(45) Date of Patent: Mar. 2, 2004

(54) INTERLEAVER DEVICE AND METHOD FOR INTERLEAVING A DATA SET

(75) Inventor: Belaiche Vincent Antoine Victor, Vitre (FR)

(73) Assignee: Mitsubishi Electric Telecom Europe, Nanterre (FR)

( * ) Notice: Subject to any disclaimer, the term of this patent is extended or adjusted under 35 U.S.C. 154(b) by 0 days.

(21) Appl. No.: 09/517,010

(22) Filed: Feb. 28, 2000

(30) Foreign Application Priority Data

Mar. 5, 1999 (EP) .............................................. 99400537

(51) Int. Cl.$^7$ ................................................ G06F 11/00
(52) U.S. Cl. ..................................................... 714/701
(58) Field of Search ............................... 714/701, 755, 714/723

(56) References Cited

U.S. PATENT DOCUMENTS

| | | |
|---|---|---|
| 5,136,588 A | 8/1992 | Ishijima |
| 5,592,492 A | 1/1997 | Ben-Efraim et al. |
| 5,907,560 A * | 5/1999 | Spruyt |

FOREIGN PATENT DOCUMENTS

| | | |
|---|---|---|
| FR | 2 507 844 | 12/1982 |
| WO | WO 95/18489 | 7/1995 |
| WO | WO 96/37050 | 11/1996 |
| WO | WO 97/05702 | 2/1997 |

* cited by examiner

*Primary Examiner*—Phung M. Chung
(74) *Attorney, Agent, or Firm*—Oblon, Spivak, McClelland, Maier & Neustadt, P.C.

(57) ABSTRACT

An interleaver device configured to interleave a data set, comprising an interleaver driver, a processing unit including a data processor configured to operate as an interleaver under the control of the interleaver driver, a data input device configured to input the data set to be interleaved, and a data output device configured to output an interleaved data set. The interleaver driver includes a mapping processor configured to calculate a set of bijective elementary functions ($\phi_n$) and to supply a mapping of the interleaver to the data processor. The interleaver driver also includes an interleaver definition generator configured to supply an interleaver definition to the mapping processor. The interleaver definition includes a compound function ($\phi_k o \ldots o \phi_1$) of at least one bijective elementary function drawn from the set of bijective elementary functions ($\phi_n$).

12 Claims, 6 Drawing Sheets

INTERLEAVER DEVICE AND METHOD FOR INTERLEAVING A DATA SET

FIELD OF INVENTION

The invention concerns an interleaver device for interleaving a data set comprising a data processor for running an interleaver under the control of driving means and an input means for inputting the data set to be interleaved and output means for outputting the interleaved data set.

BACKGROUND OF INVENTION

Such interleaver devices are specially useful in mobile telephones.

An interleaver is usually applied on informations transmitted on a radio channel between two radio stations.

In other technical fields, interleavers are also used for instance on data stored on a magnetic tape or a laser disk.

Turbo decoders have proved to offer near Shannon limit error protection in the case of white additive gaussian noise. One key feature of the Turbo encoder is an interleaver.

Interleaving data with a depth of N consists in:

writing N consecutive symbols of data into a buffer of size of N symbols, $i^{th}$ written symbol is written at position (i−1), and then read them in another order given by some permutation I of $\{0, \ldots, N-1\}$. $i^{th}$ read symbol is read from position I(i−1).

In other words if i is the original position of a symbol in an input block, then $I^{-1}(i)$ is its position in the output block, where $I^{-1}$ denotes the inverse permutation of I.

Deinterleaving data with a depth of N consists in:

writing N consecutive symbols of data into a buffer of size of N symbols, $i^{th}$ written symbol is written at position I(i−1), and then and then read them in another order given by some permutation I on $\{0, \ldots, N-1\}$. $i^{th}$ read symbol is read from position i−1.

To implement the interleaver and the deinterleaver, function is needed that provides the mapping I. With some simple permutation I, this mapping can be computed by a simple analytical formula that can be quickly evaluated on any known per se processing means. For instance if the interleaver is a rectangular interleaver with L lines and C columns, we have:

$$N = L \cdot C$$

$$\forall i \in \{0, \ldots, N-1\} I^{-1}(i) = (i \text{ div } C) + (i \text{ mod } C) \cdot L \quad (1)$$

In this formula (x div y) stands for the quotient of x divided by y in an Euclidian division and (x mod y) stands for the remainder in the same division.

The way this formula is to be understood is quite simple: a rectangular interleaver consists of an array of L lines and C columns. The input data is written along the lines and read along the column.

If l is line number (from 0 to L−1) and c is a column number (from 0 to C−1) of some written symbol then writing along the line comes to:

$$c = i \text{ mod } C \quad (2)$$

$$l = i \text{ div } C \quad (3)$$

that is to say:

$$i = l \cdot C + c \quad (4)$$

l and c are the co-ordinate of the $(i+1)^{th}$ written symbol. Reading along the columns comes to:

$$I^{-1}(i) = l + c \cdot L \quad (5)$$

Note that as a matter of fact, equations (4) and (5) are similar when column and line roles are inverted. By substituting equations (3) and (2) in equation (5), we get equation (1) that shows that the I mapping can be obtained by simple arithmetic computations in the case of a rectangular interleaver.

However interleavers so simple as the rectangular interleaver do not always fit the needs of a forward error coding technique. In particular, in the case of the turbo encoding, the rectangular interleaver shows very poor performance. The interleaver to be used in the turbo encoder must be more random than the regular rectangular interleaver, and however not completely random as it must still keep some good properties of spacing interleaved symbols.

The simplest way to implement that kind of interleaver is to use a table where the $i^{th}$ entry in the table is the value of I(i−1). The size of the table is directly derived from N, that is to say that at least s(N) bits are needed to implement the table where:

$$s(x) = x \cdot \lceil \log_2(x) \rceil \quad (6)$$

$\log_2(x)$ denotes the logarithm in base two of x, and $\lceil x \rceil$ denotes the ceiling of x, that is to say the least integer not less than x. When N grows bigger, then the amount of memory needed to store the table also grows bigger.

SUMMARY OF INVENTION

The aim of the invention is to provide an interleaver device which can run with very little memory to store the definition of the interleaver, even if the interleaver definition is very complex.

To this end, the invention relates to an interleaver device as defined in claim 1.

According to particular embodiments, the interleaver device may include one or more of the features defined in subclaims.

The invention proposes a method to build interleavers that are not so regular as the plain rectangular interleaver and nevertheless use far less memory than a completely tabulated interleaver.

In the case of a mobile telephone, due to real time constraint, it might be necessary to tabulate the interleaver of the invention to be able to use it, since processing the values might take too much time. However the definition can be very concise, thus holding little space in ROM. The interleaver table can held in RAM and computed off-line, during connection establishment. After call completion, the RAM can be reused for another purpose. Thus, even if the interleaver needs to be tabulated into RAM for effective use, this is all the same favourable, because the RAM can be used for something else when the call type does not need the interleaver.

Another advantage of having a concise definition from which a very large interleaver can be generated, is that a great variety of interleavers can be defined in the ROM memory, and only one of them selected at connection time.

In a particular embodiment, the interleaver definition could be transmitted over the air, as a parameter of the connection. The interleaver definition would have to follow the mobile telephone if during a hand over of the site where the interleaving is performed in the network is changed. Therefore, the next site would need to compute or select the table fast if enough during the hand over preparation time.

BRIEF DESCRIPTION OF THE DRAWINGS

The invention will be understood more clearly on reading the following description, given solely by way of example and made with reference to the drawings, in which:

FIG. 7 is an illustration of a truncated rectangular interleaver applied to a data set; and FIG. 8 is an illustration of a puncturing of an interleaver.

DETAILED DESCRIPTION

The interleaver according to the invention can be implemented on any data processing means adapted to run under the driving of a software using the splitting of the interleaver as defined hereafter.

For example, the interleaver can be implemented in a mobile telephone.

Figure 1:
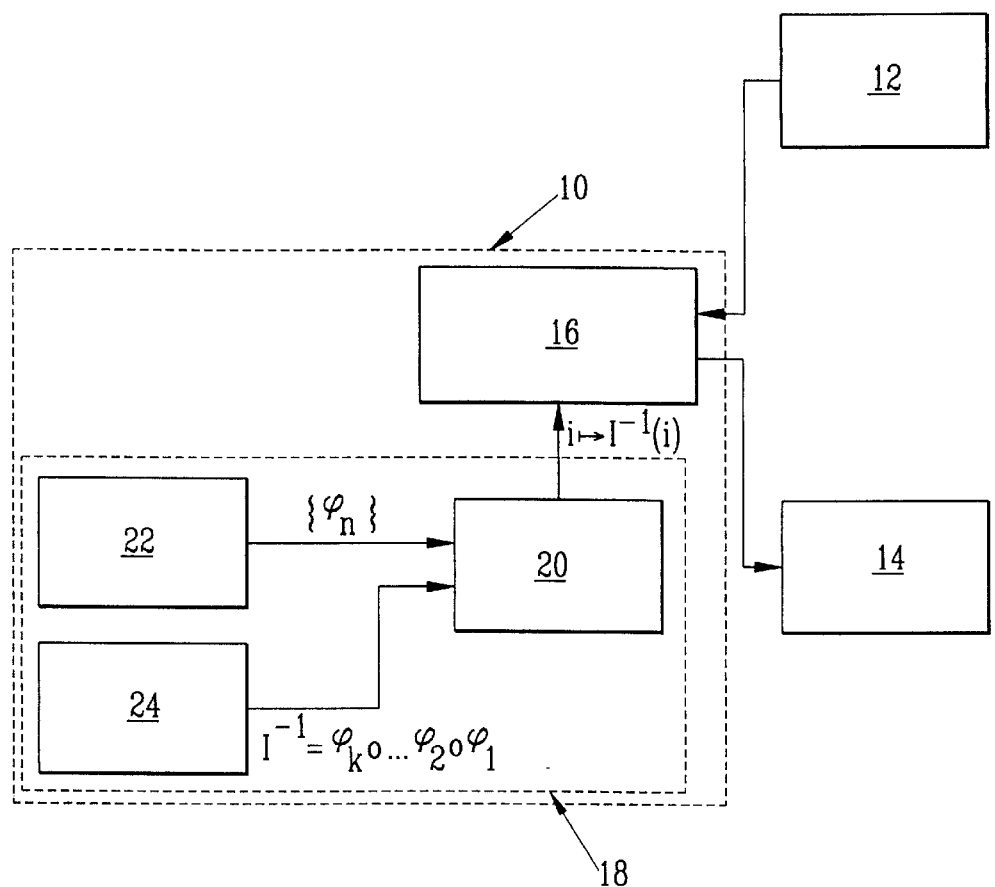
FIG. 1 is a block diagram of an interleaver device according to the invention.

Generally, and as shown on FIG. 1, the interleaver device includes a processing unit 10. It also includes means 12 for inputting a data set to be interleaved and means 14 for outputting the interleaved data.

The processing unit 10 includes a data processor 16 connected to the inputting means 12 for receiving a data set to be interleaved. It is also connected to outputting means 14 for supplying the interleaved data.

The data processor 16 is adapted for running an interleaved $I^{-1}$, the mapping of which is supplied by driving means 18. The driving means 18 comprise mapping processing means 20 which are adapted to compute a mapping of the interleaver from a set of elementary bijective functions $\phi_n$ which can be derived from a Read only memory 22. The computation is performed, according to an interleaver definition $I^{-1}$ received from interfeaver definition means 24.

In the present embodiment, the elementary functions are stored in the Read only memory 22. Typically these elementary functions may be not completely defined in ROM 22, and zero one or more additional parameters may need to be supplied for them to be operated on their argument.

Interleaver definition means 24, typically consisting of a memory, are provided to supply the definition of the interleaver $I^{-1}$ to mapping processing means 20. This definition is based on the elementary functions stored in memory 22. In particular, the interleaver $I^{-1}$ is defined as a compound of the elementary functions $\phi_n$ stored in ROM 22, along with the suitable parameters if any. The mapping processing means 20 drive the data processor 10 for it to interleave data according to the mapping which is computed by the mapping processing means 20. This mapping is determined by performing each of the functions $\phi_n$ used to define the interleaver compounded according to the interleaver definition $I^{-1}$.

Typically the mapping processing means 20 compute the mapping from the definitions from ROM 22 and interleaver definition means 24 only once during connection establishment, and then keep it in a look-up table. In another embodiment, the mapping processing means 24 compute from the definition of $I^{-1}$ the image $I^{-1}(i)$ of the position i of a data symbol to be interleaved on the fly at every symbol.

The implementation of the interleaver can be easily carried out by a man skilled in the art in view of the following explanations.

The definition of interleavers by the inventive method is recursive. The interleaver is defined by a permutation $I^{-1}$ on the set $\{0, 1, \ldots, N-1\}$ of the initial position indexes of the data to be interleaved. This set of position in-dexes, on which operates the interleaver I is split into a sum or a product of two smaller sets. Each of these two smaller sets can be then:

- either permuted by the underlying index permutation of a smaller interleaver,
- either split itself again in a sum or a product of two other smaller sets, or
- merged with a smaller set that was produced during a previous split of set.

The invention allows the use of interleavers external to the invention in place of the smaller interleavers. These external interleavers can be tabulated, or computed by a processing method different from that of the invention.

In the description, the following notations are used.
Finite Elementary Set of Integer For any non null positive integer x, $\boxed{x}$ denotes the set:

$$\boxed{x} = \{i/i \text{ integer and } 0 \leq i \leq x-1\}$$

Ellipsis Notation

The ellipsis ( ... ) notation is used in the middle of a sequence instead of the full sequence. This notation does not make any assumption on the number of literals in the formal sequence using it. These convention are quite obvious and usual. Below, some instances are given:

$A_1 \times \ldots \times A_p$ Shall be interpreted just as $A_1$ if $p = 1$ $A_1 \oplus \ldots \oplus A_p$ shall be interpreted just as $A_1$ if $p = 1$ $A_1 \oplus \ldots \oplus A_p$ shall be interpreted just as the empty set $\emptyset$ if $p = 0$ $\{x, x+1, \ldots, y-1, y\}$ where $x$ and $y$ are integers, shall be interpreted just as $\{x\}$ if $x = y$ $\{x, x+1, \ldots, y-1, y\}$ where $x$ and $y$ are integers, shall be interpreted the empty set $\emptyset$ if $x > y$

Product of Sets

If A and B are two sets, then their product A×B is the set of couples (a,b) such that a is in A and b in B. In other words:

$$A \times B = \{(a,b) / a \in A \text{ and } b \in B\} \quad 5$$

The concept can be generalised to any finite number of sets:

$$A_1 x \ldots x A_p = \{(a_1, \ldots, a_p) / \forall i \ a_i \in A_i\}$$

Furthermore, for the sake of simplicity, A×(B×C), or (A×B)×C will just be denoted A×B×C, since there are obvious bijections between these three sets, that is to say there is little difference between ((a,b),c), (a,(b,c)) and (a,b,c).

One property of the product of sets is that if $A_1, A_2, \ldots A_p$ are finite sets and their respective numbers of elements are denoted $|A_1|, |A_2|, \ldots |A_p|$, then $A_1 x \ldots x A_p$ is also finite, and its number of elements $|A_1 x \ldots x A_p|$ is such that:

$$|A_1 \times \ldots \times A_p| = \prod_{i=1}^{i=p} |A_i|$$

Union od Sets

The union (noted ∪) of two sets is the set of elements that are in at least one of these two sets. That is to say A∪B {x/x∈A or x∈B}.

Disjoint Union of Stes (Also Called Here Sun of Stes)

If A and B are two sets, then their sum A⊎B is the set of couples (t,x) such that t is equal to 1 or 2 respectively when x is A or in B.

Consequently, A⊎B ({1}×A)∪({2}×B).

1 and 2 are the usual integers and are used to distinguish the elements of A and of B in the union, so that the union is "disjoint".

The concept can be generalised to any finite number of sets:

$$A_1 \uplus \ldots \uplus A_p = (\{1\} \times A_1) \cup \ldots \cup (\{p\} \times A_p)$$

Where 1, 2, ... p are the usual whole numbers.

In the following for (t,x) in $A_1 \uplus \ldots \uplus A_p$, t is called the tag and x is called the value.

Furthermore, for the sake of simplicity, A⊎(B⊎C), and (A⊎B)⊎C will just be denoted A⊎B⊎C, since there are obvious bijections between these three sets, that is to say there is little difference between the tag sets {1, (2,1), (2,2)}, {1, (1,1), (1,2)}, and {1,2,3}. The main use of the tag is its ability to distinguish the elements according to their set of origin.

Note that the disjoint union is generally defined in literature such that A⊎B=B⊎A, that is to say there is no underlying order on the set of tags, and therefore neither are the terms ordered. However the definition is slightly modified, because this property is not desirable for this application. In the following, the expression "sum of sets" instead of "disjoint union of sets" will be used.

Finally, one property of the disjoint union of sets is that if $A_1, A_2, \ldots A_p$ are finite sets and their respective number of elements are denoted $|A_1|, |A_2|, \ldots |A_p|$, then $|A_1 \uplus \ldots \uplus A_p|$ is also finite, and its number of elements $|A_1 \uplus \ldots \uplus A_p|$ is such that:

$$|A_1 \oplus \ldots \oplus A_p| = \sum_{i=1}^{i=p} |A_i|$$

Distribution of Product of Sets Over Sun of Sets.

In the following it is considered that:

$A \times (B \uplus C)$ is the same as $(A \times B) \uplus (A \times C)$

As a matter of fact, there is an obvious bijection mapping the element (a,(t,v)) of A×(B⊎C) on the element (t,(a,v)) of (A×B)⊎(A×C). This bijection just consists in placing the tag in first position.

Similarly it is considered that (A⊎B)×C is the same as (A×C)⊎(B×C).

The interleaver I is built as follows. It enables a concise definition of the interleaver using several bijective elementary functions.

The general idea to is to build the bijection $I^{-1}: \boxed{N} \to \boxed{N}$ as the compound of several bijections $\phi_1, \phi_2, \ldots, \phi_k$. That is to say $I^{-1} = \phi_k \circ \ldots \circ \phi_2 \circ \phi_1$ This way we have:

$$\forall n \in \{1, \ldots k\} \ \varphi_n \ S^{(n-1)} \to S^{(n)}$$

With $S^{(0)} = \boxed{N}$ and $S^{(k)} = \boxed{N}$.

This way we have:

$$I^{-1}: \boxed{N} \longrightarrow \boxed{N}$$

$$S^{(0)} \ \underset{\varphi_1}{\to} \ S^{(1)} \ \underset{\varphi_2}{\to} \ \ldots \ \underset{\varphi_k}{\to} \ S^{(k)}$$

$$x \ \mapsto \ \varphi_1(x) \ \mapsto \ \ \mapsto \ I^{-1}(x) = \varphi_k(\varphi_{k-1}(\ldots \varphi_2(\varphi_1(x))\ldots))$$

and $I^{-1}$ is so built as a compound or sequence of k simpler steps, each step consisting of a bijective function $\phi_n$.

One more aspect is that each intermediate set $S^{(n)}$ can be defined as a sum of simpler sets $T_I^{(n)}$ that are products of sets of the $\boxed{x}$ form:

$$\forall n \in \{1, \ldots, k\} S^{(n)} = T_1^{(n)} \oplus \ldots \oplus T_{q_n}^{(n)} \text{ where:}$$

$$\forall n \in \{1, \ldots, k\} \forall i \in \{1, \ldots, q_n\} \ T_i^{(n)} = \boxed{N_{i,1}^{(n)}} \times \boxed{N_{i,2}^{(n)}} \times \ldots \times \boxed{N_{i,p_{i,n}}^{(n)}}$$

and with (for all the $\phi_n$ are bijective), all the intermediate sets $S^{(n)}$ having N elements:

$$\forall n \in \{0, \ldots, k\}, |S^{(n)}| = \sum_{i=1}^{i=q_n} \left( \prod_{j=1}^{j=p_{i,n}} N_{i,j}^{(n)} \right) = N$$

and also $q_0=1$ $p_{1,0}=1$, $N_{1,1}^{(0)}=N$, $q_k=1$, $p_{1,k}=1$ and $N_{1,1}^{(k)}=N$, because Note that for the present application, it is needed that each $\phi_n$ be easily implementable by an algorithm that can be run on existing processing means.

Several types of $\phi_n$ elementary functions are defined. The different $\phi_n$ elementary functions form a set of elementary functions which are stored in memory 22, so that their algorithm can be run by the mapping processing means 20 according to the interleaver definition $I^{-1}$.

Here is an introductory list of the functions that will be presented in more details later:

A. Functions to simplify the definitions of the other functions by putting in first position the terms or factors on which the next function is to operate:
   Term permutation
   Factor permutation
B. Functions to decompose $S^{(n-1)}$ into an $S^{(n)}$ with more terms or factors:
   Elementary term split
   Elementary factor split
C. Functions ensuring the equivalence between $A \times (B \uplus C)$ and $(A \times B) \uplus (A \times C)$
   Factorisation
   Distribution
D. Function to interleave a part of $S^{(n-1)}$
   Elementary interleaving: embedding of an interleaver external to the invention
   Affine-mod: a linear relation followed by a modulus, and operating on a term of $S^{(n-1)}$ as if it was a vector space whose dimension is the number of factors in this term,
E. Functions to simplify $S^{(n-1)}$ into an $S^{(n)}$ with fewer terms or factors:
   Elementary factor merge
   Elementary term merge The different functions are as follows.

Term Permutation $\phi_n$
In that case:
$q_n = q_{n-1}$
$\sigma$ a permutation of $\{1, \ldots, q_n\}$, and
$\forall i \in \{1, \ldots, q_n\} T_{\sigma(i)}^{(n)} = T_i^{(n-1)}$
$\phi_n$ is defined as:

$$\varphi_n: S^{(n-1)} \to S^{(n)}$$
$$(t, v) \mapsto (\sigma(t), v)$$

In the definition above t is the tag of (t,v), and v the value.
Example:
$$S^{(n-1)} = \boxed{2} \times \boxed{3} \oplus \boxed{4} \times \boxed{5} \oplus \boxed{3}$$
$$S^{(n)} = \boxed{3} \oplus \boxed{4} \times \boxed{5} \oplus \boxed{2} \times \boxed{3}$$
$$\sigma = (3, 2, 1)$$

And for instance we have the following mappings:
$$\varphi_n: (1, (1, 1)) \mapsto (3, (1, 1))$$
$$(3, (2)) \mapsto (1, (2))$$
$$(2, (3, 0)) \mapsto (2, (3, 0))$$

Factor Permutation $\phi_n$
The factor permutation $\phi_n$ function permutes the factors in the product constituting the first term of $S^{(n-1)}$. In fact the same principle could be used to permutes the factors of any term, but this is not needed for the definition thanks to the term permutation function defined above.
In that case we have:
$q_n = q_{n-1}$
$p_{1,n} = p_{1,n-1}$
$\sigma$ a permutation of $\{1, \ldots, p_{1,n-1}\}$
$\forall i \in \{2, \ldots, q_n\} = T_i^{(n-1)}$
$\forall j \in \{1, \ldots, p_{1,n-1}\} N_{1,j}^{(n)} = N_{1,\sigma(j)}^{(n-1)}$
$\phi_n$ is defined as:

$$\varphi_n: S^{(n-1)} \to S^{(n)}$$
$$x = (t, (x_1, x_2 \ldots x_{p_{t,n-1}})) \mapsto \begin{cases} (1, (x_{\sigma(1)}, x_{\sigma(2)} \ldots x_{\sigma(p_{1,n-1})})) & \text{if } t = 1 \\ x & \text{otherwise} \end{cases}$$

Example:
$$S^{(n-1)} = \boxed{2} \times \boxed{3} \times \boxed{4} \oplus \boxed{3}$$
$$S^{(n-1)} = \boxed{3} \times \boxed{2} \times \boxed{4} \oplus \boxed{3}$$

$\sigma = (2,1,3)$
And for instance we have the following mappings:
$$\varphi_n: (1, (1, 2, 3)) \mapsto (1, (2, 1, 3))$$
$$(2, (2)) \mapsto (2, (2))$$
$$(1, (0, 1, 2)) \mapsto (1, (1, 0, 2))$$

For the term or factor permutation, $\phi_n$ is made at null processing cost. The only added value of $\phi_n$ is that it makes simpler the definitions that will follow by alleviating the notation. The following definitions are applicable to any terms or factors in a sum or product of sets, respectively, instead, thanks to the factor permutation $\phi_n$ we can without any loss of generality make them only for the first or the first and some subsequent terms or factors according to the case.

In consequence the permutation $\sigma$ is typically the compound of zero, one or two transpositions. A transposition is a permutation that swaps two elements of a set, and let the other unchanged. Thus such a permutation $\sigma$ puts in the first position the terms or factors on which the next function $\phi_n$ is to operate. In other words the term or factor permutation function specifies on which term(s) or factor(s) is operating the next function in the $\phi_k° \ldots °\phi_2°\phi_1$ compound.

Figure 3:
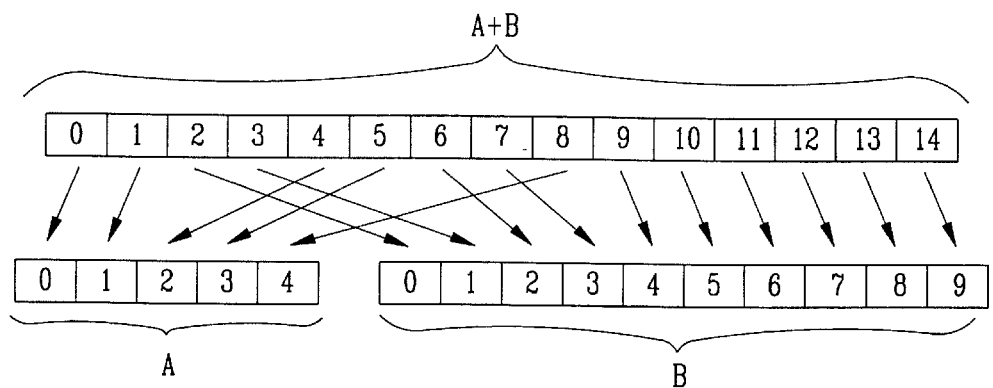
FIG. 3 is an illustration of a term splitting function applied on a data set.

Elementary Term Split $\phi_n$
The elementary term split function $\phi_n$ is splitting the first factor in the first term of $S^{(n-1)}$ into a $\uplus$ sum of two sets. In fact, the same principle could be used to split any factor of any term, but this is not needed for the definition, thanks to the term and factor permutation functions defined above. An example is given on FIG. 3.

$S^{(n)}$ is such that from $S^{(n-1)}$ to $S^{(n)}$, nothing is changed except the first factor $\boxed{A+B}$ of the first term $T_1^{(n-1)}$ that is split by a bijection f into the $\uplus$ sum of $\boxed{A}$ of and $\boxed{B}$ on which are then distributed the subsequent factors, if any, of the first term of $S^{(n-1)}$.

In that case:
$q_n = q_{n-1} + 1$, i.e. one more term
$\forall i \in \{2, \ldots, q_{n-1}\} T_{i+1}^{(n)} = T_i^{(n-1)}$, i.e. the subsequent terms unchanged
A and B are two positive and non null integers, and $N_{1,1}^{(n-1)} = A+B$, $N_{1,1}^{(n)} = A$ and $N_{2,1}^{(n)} = B$ $p_{1,n}=p_{2,n}=p_{1,n-1}$ and $\forall j \in \{2, \ldots, p_{1,n-1}\} N_{1,j}^{(n)} = N_{2,j}^{(n)} = N_{1,j}^{(n-1)}$ a bijection $f: \boxed{A+B} \to \boxed{A} \oplus \boxed{B}$
$x \mapsto (t_f(x), v_f(x))$ where $t_f(x)$ and $v_f(x)$ respectively denote the tag and the value of f(x) in $\boxed{A} \uplus \boxed{B}$ Note that the conditions of 3$^{rd}$ and 4$^{th}$ bullets are such that:

$$T_1^{(n-1)} = \boxed{A+B} \times T'$$

$$T_1^{(n)} = \boxed{A} \times T'$$

$$T_2^{(n)} = \boxed{B} \times T'$$

And $T' = \boxed{N_{1,2}^{(n-1)}} \times \ldots \times \boxed{N_{1,p_{1,n-1}}^{(n-1)}}$ $\phi_n$ is built as:

$$\varphi_n: S^{(n-1)} \to S^{(n)}$$
$$x \mapsto \begin{cases} (t_f(x_1), (v_f(x_1), x_2 \ldots x_{p_{1,n-1}})) & \text{if } t=1 \\ (t+1, v) & \text{otherwise} \end{cases}$$

with
$x = (t, v)$
and
$v = (x_1, x_2 \ldots x_{p_{t,n-1}})$

The f bijections used by the elementary term split function can be defined as follows.

$f: \boxed{A+B} \to \boxed{A} \oplus \boxed{B}$ main functions

There are many possible functions that all are computable on any current processor.

As an example of f, the mod-threshold term split function will be described hereafter:

In this function, the modulus of an element x of $\boxed{A+B}$ by some constant C is computed. Then it is compared to a threshold T. According to the result of this comparison, it is decided to map x either to $\boxed{A}$ or to $\boxed{B}$. Constants C and T are such that:

$0 < T < C$

In order to understand more easily how the mod-threshold function works, a simplified algorithm will be first presented. The simplified algorithm cannot make the mapping in a random way, but only in a sequential way, that is to say it can map element x, only after having mapped elements 0, 1, ..., x-1 before.

In the simplified algorithm there are two counters nA and nB that hold the number of elements that have already been respectively mapped to $\boxed{A}$ and $\boxed{B}$.

$n_A := 0;$
$n_B := 0;$
for $x := 0$ to $A+B-1$ do
   begin
      if$(n_A = A)$then
      begin
         remark $\boxed{A}$ is full, then map $x$ to $\boxed{B}$
         map $x$ to $(2, n_B)$;
         $n_B := n_B + 1;$
      end
      else if$(n_B = B)$then
      begin
         remark $\boxed{B}$ is full, then map $x$ to $\boxed{A}$
         map $x$ to $(1, n_A)$
         $n_A := n_A + 1;$
      end
      else
      begin
         remark neither $\boxed{A}$ or $\boxed{B}$ are yet full, then map $x$ according to threshold of modulus
         $c := x \bmod C;$
         if $c < T$ then
         begin
            map $x$ to $(1, n_A);$
            $n_A := n_A + 1;$
         end
         else
         begin
            map $x$ to $(2, n_B);$
            $n_B := n_B + 1;$
         end
      end
   end Now, an algorithm that can work with random values of x in input (x not given in a sequential way) is presented. Three constants $x_M$, $v_M$ and $t_M$ are derived from A, B, C and T according to the following definitions and formulas:

$x_M$ is the greatest x while neither $\boxed{A}$ nor $\boxed{B}$ are yet full in the simplified algorithm above.

$t_M$ is the tag of the set ($\boxed{A}$ or $\boxed{B}$) not yet full after $x_M$ has been reached by x in the simplified algorithm $v_M$ is the greatest value of the set not yet full while both sets are not yet full in the simplified algorithm.

$x_M$, $t_M$ and $v_M$ can be alternatively defined by the following formulas:

$$x_M \stackrel{\Delta}{=} \max\left\{x \in \boxed{A+B} \middle/ \begin{pmatrix} l \cdot T + c < A & \text{if } c < T \\ \text{and} & \\ l \cdot (C-T) + c - T < B & \text{otherwise} \end{pmatrix}\right\}, \text{ where } l \stackrel{\Delta}{=} x \text{ div } C, \text{ and } c \stackrel{\Delta}{=} x \bmod C$$

$$t_M \stackrel{\Delta}{=} \begin{cases} 1 & \text{if}((x_M + 1) \bmod C) \geq T \\ 2 & \text{otherwise} \end{cases}$$

$$\text{if } t_M = 1 \text{ then } v_M \stackrel{\Delta}{=} \max\left\{v/\exists x \leq x_M, \begin{pmatrix} l \stackrel{\Delta}{=} x \text{ div } C \\ \text{and} \\ c \stackrel{\Delta}{=} x \bmod C \end{pmatrix} \Rightarrow \begin{pmatrix} c < T \\ \text{and} \\ v = l \cdot T + c \end{pmatrix}\right\}$$

$$\text{if } t_M = 2 \text{ then } v_M \stackrel{\Delta}{=} \max\left\{v/\exists x \leq x_M, \begin{pmatrix} l \stackrel{\Delta}{=} x \text{ div } C \\ \text{and} \\ c \stackrel{\Delta}{=} x \bmod C \end{pmatrix} \Rightarrow \begin{pmatrix} c \geq T \\ \text{and} \\ v = l \cdot (C-T) + c - T \end{pmatrix}\right\}$$

Then the algorithm that maps x onto (t,v) is the following:

if($x \leq x_M$) then begin remark Neither $\boxed{A}$ nor $\boxed{B}$ are yet full, then discrimination is based on threshold if($x \bmod C$) < $T$ then begin $t := 1$;

$v := (x \text{ div } C) \cdot T + (x \bmod C)$;

end else begin $t := 2$;

$v := (x \text{ div } C) \cdot (C - T) + ((x \bmod C) - T)$;

end end else begin remark $\boxed{A}$ or $\boxed{B}$ is already full, then no more discrimination the remainder of $\boxed{A+B}$ is mapped to the set not yet full, that is to say that with tag $t_M$ $t := t_M$;

$v := x - x_M + v_M$;

end

Figure 2:
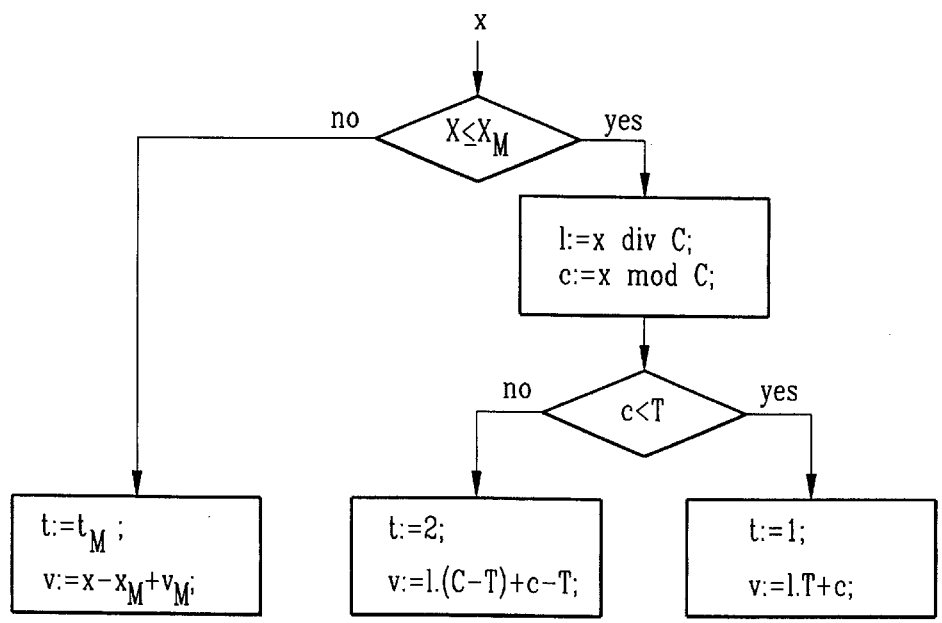
FIG. 2 is a flow-chart showing a Mod-threshold term splitting algorithm.

The Mod-threshold term splitting algorithm is also shown on FIG. 2. The result of the algorithm is illustrated on FIG. 3 in the case of A=5, B=10, C=4 and T=2.

For some particular value to T and C the definition can be simplified. For instance when C=A+B and T=A, f is defined as:

$$f: \boxed{A+B} \rightarrow \boxed{A} \oplus \boxed{B}$$
$$x \mapsto (t, v)$$

with if $x < A$ then $t = 1$ and $v = x$ else $t = 2$ and $v = x - A$

Another simplification occurs when given the values of D=A+B, C and T, A and B are chosen such that the comparison of x to $x_M$ is not necessary, and only the comparison of the modulus to the threshold needs to be done. That is to say the mod-threshold term split function can be more simply written as:

$$f: \boxed{A+B} \rightarrow \boxed{A} \oplus \boxed{B}$$
$$x \mapsto (t, v)$$

with if $c < T$ then $t = 1$ and $v = l \cdot T + c$ else $t = 2$ and $v = l \cdot (C - T) + c - T$ where $\begin{cases} c = x \bmod C \\ l = x \text{ div } C \end{cases}$ Given D=A+B, C and T, the value of A and B for which this simplification occurs can be computed as:

$$\begin{cases} A = |\{x \in \boxed{D} / (x \bmod C) < T\}| \\ B = |\{x \in \boxed{D} / (x \bmod C) \geq T\}| \end{cases} \qquad (7)$$

where $|\cdot|$ denotes the number of elements in a set.

This can also be more simply computed as:

$$\begin{cases} A = 1 + l_A \cdot T + c_A & \text{where} \begin{cases} l_A = x_A \text{ div } C, \\ c_A = x_A \text{ mod } C, \text{ and} \\ x_A = \max\{x \in \boxed{D}/ \\ (x \text{ mod } C) > T\} \end{cases} \\ B = 1 + l_B \cdot (C - T) + c_B - T & \text{where} \begin{cases} l_B = x_B \text{ div } C, \\ c_B = x_B \text{ mod } C, \text{ and} \\ x_B = \max\{x \in \boxed{D}/ \\ (x \text{ mod } C) \geq T\} \end{cases} \end{cases}$$

Finally $x_A$ and $x_B$ can be more simply computed by the following algorithm:

$c := (d - 1) \text{mod } C;$ if $c < T$ then begin $x_A := (D - 1);$ $x_B := (D - 1) - (c + 1);$ end else begin $x_B := (D - 1);$ $x_A := (D - 1) - (c + 1) + T;$ end For instance D=10 C=5 T=2 will yield $x_B=9$, $x_A=6$, $l_A=1$, $c_A=1$, $l_B=1$, $c_B=4$, A=4 and B=6.

Selecting A and B such that the algorithm is simplified can result in less processing power requirement toprepare to interleaver table, or to compute the interleaver real time, or less Integrated Circuit surface, if this real time 20 term. splitting procedure is performed by an ASIC.

Elementary Factor Split $\phi_n$

The elementary factor split $\phi_n$ function is splitting the first factor in the first term of $S^{(n-1)}$ into a x product of two sets. In fact the same principle could be used to split any factor of any term, but this is not needed for the definition thanks to the term and factor permutation functions defined above.

$S^{(n)}$ is such that from $S^{(n-1)}$ to $S^{(n)}$, nothing is changed except the first factor $\boxed{A \cdot B}$ of the first term that is split by a bijection g into the x product of $\boxed{A}$ and $\boxed{B}$.

In that case:

$q_n = q_{n-1}$, i.e. same number of terms $\forall i \in \{2, \ldots, q_{n-1}\} T_i^{(n)} = T_i^{(n-1)}$, i.e. the subsequent terms unchanged $p_{1,n} = p_{1,n-1} + 1$, i.e. one more factor in first term $\forall j \in \{2, \ldots, p_{n-1}\} N_{1,j+1}^{(n)} = N_{1,j}^{(n-1)}$ A and B defined by $A \triangleq N_1^{(n)}$, $B \triangleq N_2^{(n)}$, and thus $A \cdot B = N_1^{(n-1)}$ a bijection $g: \boxed{A \cdot B} \rightarrow \boxed{A} \times \boxed{B}$ $x \mapsto (g_1(x), g_2(x))$ $\varphi_n$ is built as:

$\varphi_n: S^{(n-1)} \rightarrow S^{(n)}$ $x \mapsto \begin{cases} (1, (g_1(x_1), g_2(x_1), \text{ if } t = 1 \\ x_2 \ldots, x_{p_{1,n-1}})) \\ x \quad \text{otherwise} \end{cases}$ with $x = (t, v)$ and $v = (x_1, x_2 \ldots x_{p_{t,n-1}})$ The g bijections used by the elementary factor split function can be defined as follows:

$g: \boxed{A \cdot B} \rightarrow \boxed{A} \times \boxed{B}$ main factor split functions There are many possible functions that all are computable on any current processor.

Here are some examples:

In the following for all x and y integer such that y>0:

x div y stands for the quotient of Euclidian division of x by y, x mod y stands for the remainder of Euclidian division of x by y.

Note that $\forall x \forall y \, y>0$, (x mod y)$\in \boxed{y}$, even for $x \leq 0$ The DIV-MOD factor split function:

$g: \boxed{A \cdot B} \rightarrow \boxed{A} \times \boxed{B}$ $x \mapsto (x \text{ div } B, x \text{ mod } B)$ This function is clearly bijective and:

$g^{-1}((a,b)) = a \times B + b$

Figure 4:
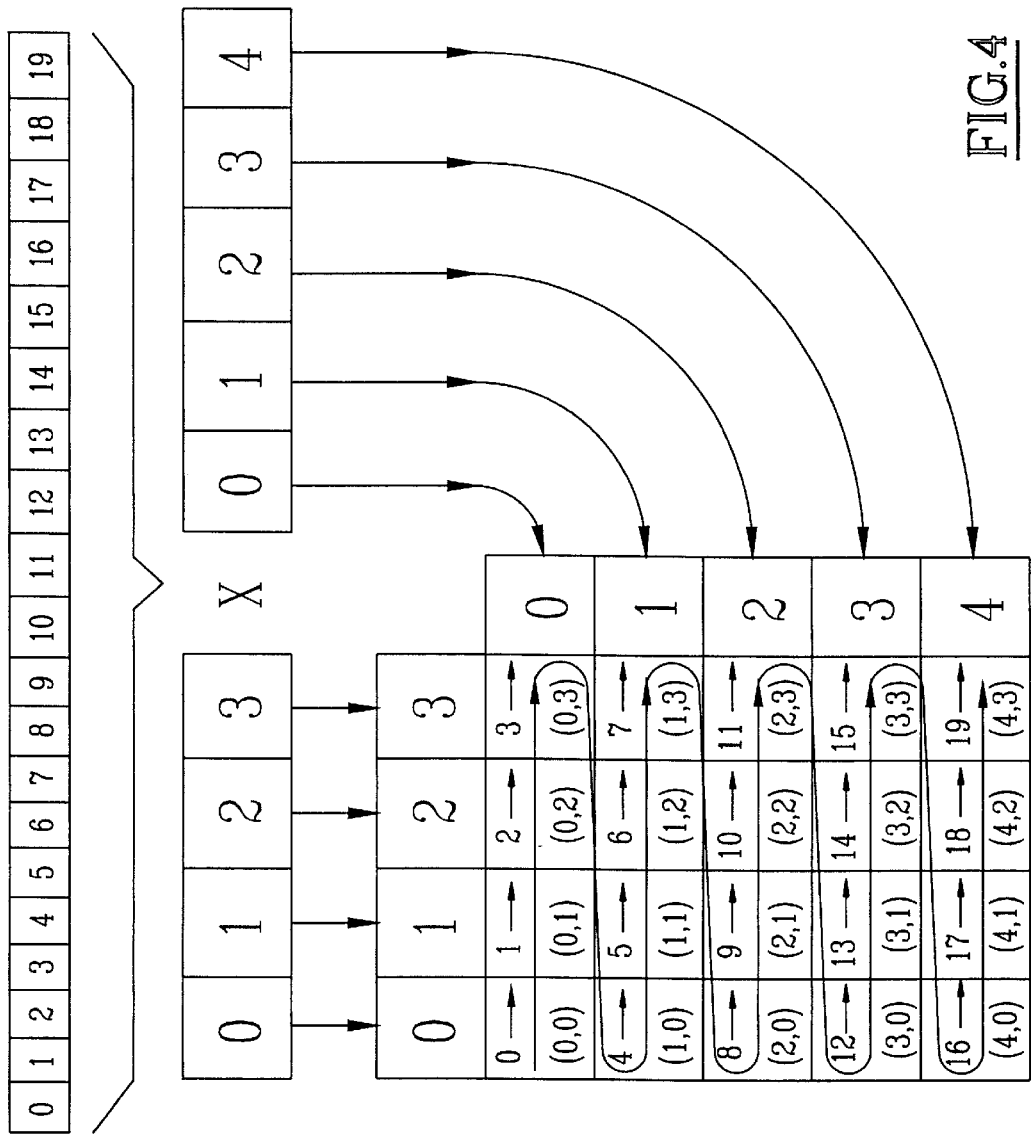
FIG. 4 is an illustration of a Div-mod factor split function applied on a data set.

The div-mod factor split function is illustrated on FIG. 4.

The MOD-MOD factor split function:

This function can be used only when the greatest common divider of A and B is 1 (that is to say A^B=1).

$g: \boxed{A \cdot B} \rightarrow \boxed{A} \times \boxed{B}$ $x \mapsto (x \text{ mod } A, x \text{ mod } B)$ The fact that the greatest common divider of A and B is 1 ensures the existence of two integers A' and B' such that $B \cdot B' + A \cdot A' = 1$.

Figure 5:
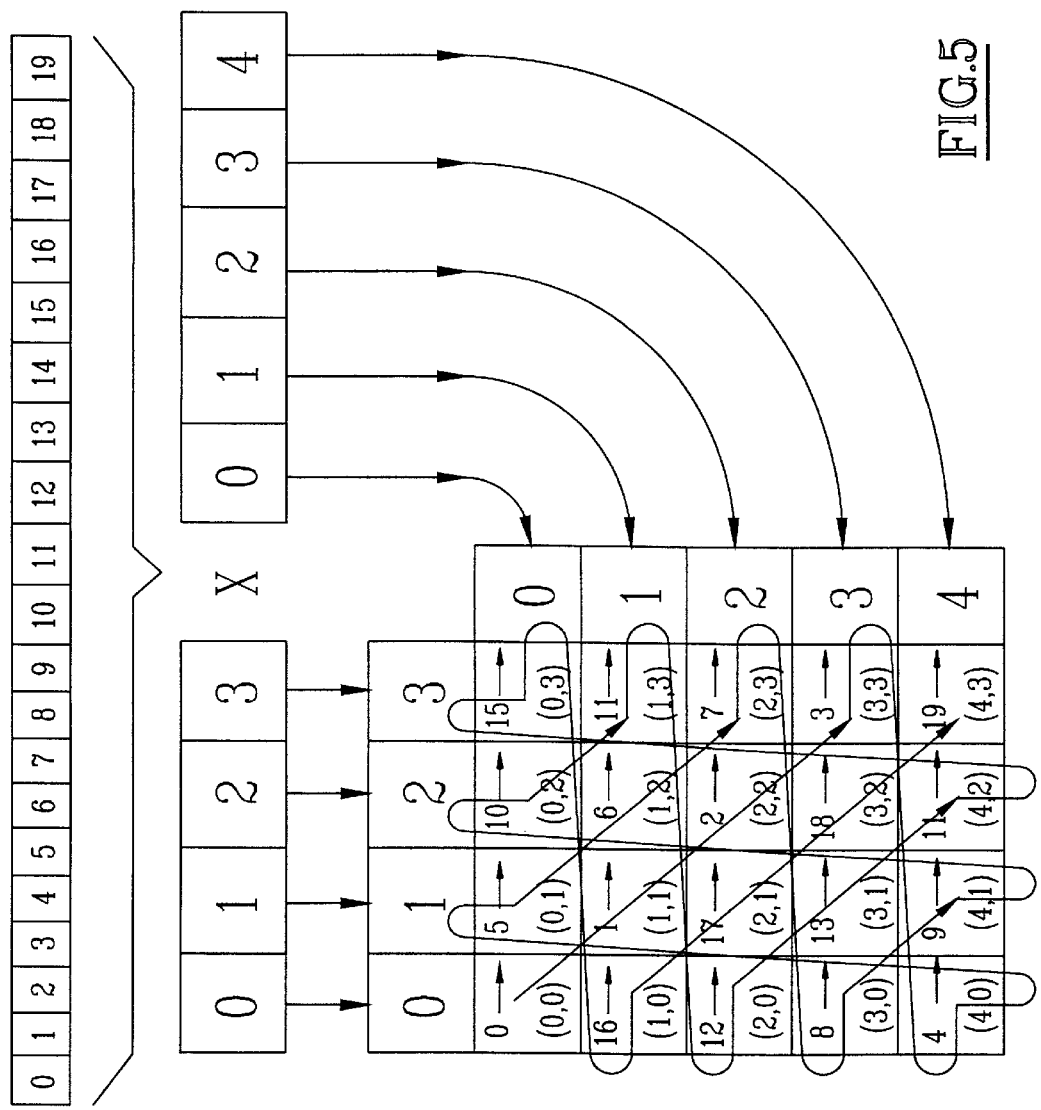
FIG. 5 is an illustration of a mod-mod factor split function applied on a data set.

This allows to build easily the inverse of g as:

$g^{-1}((a,b)) = b + '(((a-b) \cdot B') \text{ mod } A) \cdot B = (a \cdot B \cdot B' + b \cdot A \cdot A') \text{ mod } (A \cdot B)$ The mod-mod factor split function is illustrated on FIG. 5.

Factorisation $\phi_n$

The factorisation $\phi_n$ function groups several equal terms of a sum of sets, into a product of sets. This uses the obvious bijection between:

$\underbrace{B \oplus \ldots \oplus B}_{A \text{ times}}$ And $\boxed{A} \times B$ This bijection simply maps the tag-value couple (t,v) on the value only list (t-1,v), making of the tag t an element t-1 of $\boxed{A}$.

The factorisation $\phi_n$ thus factorises the A first terms for $S^{(n-1)}$. In fact the same principle could be used to factorise any terms in $S^{(n-1)}$ provided that they are equal, but this is not needed for the definition thanks to the term permutation functions defined above.

$S^{(n)}$ and $S^{(n-1)}$ are such that:

A is positive non null integer such that $q_n = q_{n-1} - A + 1$, because A terms of $S^{(n-1)}$ are merged in one, $\forall i \in \{1, \ldots, A\} T_i^{(n-1)} = T_1^{(n-1)}$, that is to say the A first terms of $S^{(n-1)}$ are identical, $\forall i \in \{2, \ldots, q_n\} T_i^{(n)} = T_{i+A-1}^{(n-1)}$, that is to say the terms following the A first terms of $S^{(n-1)}$ are unaffected $\phi_n$ is built as:

$$\varphi_n: S^{(n-1)} \to S^{(n)}$$
$$x \mapsto \begin{cases} (x_1 + 1, (x_2, x_3 \ldots, x_{p_{1,n-1}})) & \text{if } t = 1 \\ (t + A - 1, v) & \text{otherwise} \end{cases}$$

with $x = (t, v)$ and $v = (x_1, x_2 \ldots x_{p_{t,n-1}})$

Distribution $\phi_n$

The distribution $\phi_n$ function does the inverse operation of the factorisation $\phi'_n$ that was described in the previous section. That is to say the first factor of the first term in $S^{(n-1)}$ becomes a tag for a sum.

In fact the same principle could be used on any factor of any term of $S^{(n-1)}$ provided that the term containing that factor has at least two factors, but this is not needed for the definition thanks to the term permutation functions defined above.

$S^{(n)}$ and $S^{(n-1)}$ are such that:

A is a positive non null integer such that $N_{1,1}^{(n-1)} = A$ $q_n = q_{n-1} + A - 1$, that is to say 1 term of $S^{(n-1)}$ is distributed over A terms of $S^{(n)}$ $p_{1,n-1} > 1$ (first term of $S^{(n-1)}$ has at least two factors)

$\forall i \in \{1, \ldots, A\} p_{i,n} = p_{1,n-1} - 1$, the A first terms of $S^{(n)}$ have one factor fewer—the one that was distributed—than the first term of $S^{(n-1)}$ $\forall i \in \{1, \ldots, A\} \forall j \in \{1, \ldots, p_{1,n} - 1\} N_{i,j}^{(n)} = N_{1,j+1}^{(n-1)}$, the A first terms of $S^{(n)}$ are all identical and equal to the first term of $S^{(n-1)}$ without its first factor $\forall i \in \{2, \ldots, q_{n-1}\} T_{i+A-1}^{(n)} = T_i^{(n-1)}$, the $q_{n-1} - 1$ subsequent terms of $S^{(n-1)}$ are un-affected $\phi_n$ is built as:

$$\varphi_n: S^{(n-1)} \to S^{(n)}$$
$$x \mapsto \begin{cases} (x_1 + 1, (x_2, x_3 \ldots, x_{p_{1,n-1}})) & \text{if } t = 1 \\ (t + A - 1, v) & \text{otherwise} \end{cases}$$

with $x = (t, v)$ and $v = (x_1, x_2 \ldots x_{p_{t,n-1}})$

Elementary Interleaving $\phi_n$

The elementary interleaving $\phi_n$ function permutes the elements of the first factor in the first term of $S^{(n-1)}$. In fact the same principle could be used to permute the elements of interleave any factor of any term, but this is not needed for the definition thanks to the term and factor permutation functions defined above.

$S^{(n)}$ and $S^{(n-1)}$ are of course equal.

In that case:

$S^{(n)} = S^{(n-1)}$

A an integer such that $A = N_{1,1}^{(n)}$

- a bijection $\iota: \boxed{A} \to \boxed{A}$ $\varphi_n$ is built as:

$$\varphi_n: S^{(n-1)} \to S^{(n)}$$
$$x \mapsto \begin{cases} (1, (\iota(x_1), x_2, \ldots, x_{p_{1,n-1}})) & \text{if } t = 1 \\ x & \text{otherwise} \end{cases}$$

with $x = (t, v)$ and $v = (x_1, x_2 \ldots x_{p_{t,n-1}})$

Here are some examples of $\iota$ bijection used by the elementary permutation function.

The tabulated $\iota$ function:

In that case the $\iota$ is implemented by a table in the memory of the processing unit. There are A entries in that table and $\iota(x)$ is written insthe $(x+1)^{th}$ entry.

The table therefore requires $s(A)$ bits (where s is defined in equation (6))

Affine-mod $\phi_n$

The affine-mod $\phi_n$ function acts in the first terms of $S^{(n-1)}$ as if it was a vector space of dimension $p_{1,n-1}$. In fact the same principle could be used on any term, but this is not needed for the definition thanks to the term permutation functions defined above.

$S^{(n)}$ and $S^{(n-1)}$ are of course equal.

In that case:

$S^{(n)} = S^{(n-1)}$ $m \triangleq p_{1,n-1}$ an m line m column matrix $U = [u_{i,j}]$ such that $\forall i \in \{1, \ldots, m\} \forall j \in \{1, \ldots, m\} u_{i,j}$ is integer (possibly negative)

a m line vector $V = [v_i]$ such that:

$\forall i \in \{1, \ldots, m\} v_i$ is integer (possibly negative) $\phi_n$ is built as:

$$\varphi_n: S^{(n-1)} \to S^{(n)}$$
$$(t, x) \mapsto \begin{cases} (1, y) & \text{if } t = 1 \\ (t, x) & \text{otherwise} \end{cases}$$

with for $t = 1$ $x = (x_1, x_2 \ldots, x_m)$ $y = (y_1, y_2 \ldots, y_m)$ such that:

$$\begin{bmatrix} z_1 \\ \vdots \\ z_m \end{bmatrix} = U \cdot \begin{bmatrix} x_1 \\ \vdots \\ x_m \end{bmatrix} + V$$

and $\forall i \in \{1, \ldots, m\} y_i = z_i \bmod N_i^{(n)}$

Furthermore U and V are such that the $\phi_n$ obtained be bijective.

One sufficient condition to be fulfilled by U and V for the affine-mod $\phi_n$ to be bijective is the following one:

U is the product of two matrices $U^{(1)}$, and $U^{(2)}$.

The elements of these matrices are denoted this way:
$$\forall k \in \{1,2\} U^{(k)} = [u_{i,j}^{(k)}]$$

$U^{(1)}$ is a sub-diagonal matrix with a diagonal of 1 or −1, that is to say:

$$\begin{cases} \forall (i,j) \in \{1, \ldots, m\}^2, j > i \Rightarrow u_{i,j}^{(1)} = 0 \\ \text{and} \\ \forall i \in \{1, \ldots, m\}, u_{i,i}^{(1)} = 1 \quad \text{or} \quad u_{i,j}^{(1)} = -1 \end{cases}$$

$U^{(2)}$ is a diagonal matrix with for all i, $i^{th}$ diagonal element primary with $N_{1,i}^{(n)}$, That is to say:

$$\begin{cases} \forall (i,j) \in \{1, \ldots, m\}^2, j \neq i \Rightarrow u_{i,j}^{(2)} = 0 \\ \text{and} \\ \forall i \in \{1, \ldots, m\}, u_{i,i}^{(2)} \text{ and } N_{1,i}^{(n)} \text{ greatest common divider is 1} \end{cases}$$

Product is done in this order: $U = U^{(2)} \cdot U^{(1)}$

Note: $U^{(1)}$ can be also super-diagonal (elements under diagonal are null) instead of sub-diagonal, this comes up to the same thanks to the factor permutation $\phi_n$ function.

Annexe on Affine-mod Functions

Here is given a proof of the sufficient condition that was given to build the affine-mod $\phi_n$ functions. Let us recall the definition of the affine-mod function where we have omitted the n index that brings no information here, and we have replaced it by a U index, meaning that this is the $\phi$ that is generated by some matrix U. For alleviating the notation we have also omitted the term index (specifying that we are working on the first term of $S^{(n-1)}$).

$$\varphi_U : \boxed{N_1} \times \boxed{N_2} \times \ldots \times \boxed{N_p} \to \boxed{N_1} \times \boxed{N_2} \times \ldots \times \boxed{N_p}$$
$$(x_1, x_2 \ldots x_p) \mapsto (y_1, y_2 \ldots y_p)$$

such that:

$$\begin{bmatrix} z_1 \\ \vdots \\ z_m \end{bmatrix} = U \cdot \begin{bmatrix} x_1 \\ \vdots \\ x_p \end{bmatrix} + V$$

and $$\forall i \in \{1, \ldots, p\} y_i = z_i \bmod N_i$$

Since the from and to sets are the same and are finite, it is cleady necessary and sufficient to show that $\phi_U$ is injective in order to show that $\phi_U$ is bijective.

Let Z denote the set of signed integers, then bijectivity of $\phi_U$ is equivalent to the injectivity definition, i.e.:

$$\forall (q_1, q_2 \ldots q_p) \in Z^p$$
$$\forall (x_1, x_2 \ldots x_p) \in \boxed{N_1} \times \boxed{N_2} \times \ldots \times \boxed{N_p},$$
$$\forall (y_1, y_2 \ldots y_p) \in \boxed{N_1} \times \boxed{N_2} \times \ldots \times \boxed{N_p}$$

$$U \cdot \begin{bmatrix} x_1 \\ \vdots \\ x_p \end{bmatrix} + V = U \cdot \begin{bmatrix} y_1 \\ \vdots \\ y_p \end{bmatrix} + V + \begin{bmatrix} q_1 \cdot N_1 \\ \vdots \\ q_p \cdot N_p \end{bmatrix} \Rightarrow \begin{bmatrix} x_1 \\ \vdots \\ x_p \end{bmatrix} = \begin{bmatrix} y_1 \\ \vdots \\ y_p \end{bmatrix}$$

Then by a simple subtraction, by using linearity of U, and by making some variable change on $x_i - y_i$ it comes that bijectivity of $\phi_U$ is equivalent to $$\left. \begin{array}{l} \forall (q_1, q_2 \ldots q_p) \in Z^p \\ \forall (x_1, x_2 \ldots x_p) \in [-N_1+1, N_1-1] \times \ldots \times [-N_p+1, N_p-1] \end{array} \right\},$$

$$U \cdot \begin{bmatrix} x_1 \\ \vdots \\ x_p \end{bmatrix} = \begin{bmatrix} q_1 \cdot N_1 \\ \vdots \\ q_p \cdot N_p \end{bmatrix} \Rightarrow \begin{bmatrix} x_1 \\ \vdots \\ x_p \end{bmatrix} = \begin{bmatrix} 0 \\ \vdots \\ 0 \end{bmatrix}$$

Where in the equation above all [a,b] denotes an interval of signed integers comprised between a and b inclusive.

Now let us assume that U is a sub-diagonal matrix, with a diagonal of 1 or −1, that is to say:

$$\begin{cases} \forall (i,j) \in \{1, \ldots, m\}^2, j > i \Rightarrow u_{i,j} = 0 \\ \text{and} \\ \forall i \in \{1, \ldots, m\}, \quad u_{i,i} = 1 \text{ or } u_{ij} = -1 \end{cases}$$

(with of course all the elements of U integers).

If such a condition is fuilfilled then U is clearly inversible and the inverse $U^{-1}$ of U is also a sub-diagonal matrix with a diagonal of 1 or −1 and all elements still integers. This is trivially derived by the Gauss pivot algorithm applied to inverse matrix U.

The equation $$U \cdot \begin{bmatrix} x_1 \\ \cdot \\ \cdot \\ x_p \end{bmatrix} = \begin{bmatrix} q_1 \cdot N_1 \\ \cdot \\ \cdot \\ q_p \cdot N_p \end{bmatrix}$$

can be written:

$$\begin{bmatrix} x_1 \\ \cdot \\ \cdot \\ x_p \end{bmatrix} = U^{-1} \cdot \begin{bmatrix} q_1 \cdot N_1 \\ \cdot \\ \cdot \\ q_p \cdot N_p \end{bmatrix}$$

Let us denote $u'_{i,j}$ the elements of $U^{-1} = [u'_{i,j}]$ $U^{-1}$ is a subdiagonal matrix with all element integer and a diagonal of 1 or −1.

Then by recurrence:

$x_1$ is clearly null, because $x_1 = u'_{1,1} \cdot q_1 \cdot N_1$, $q_1$ and $u'_{1,1}$ are integer, and 0 is the only multiple $N_1$ in $[-N_1+1, N_1-1]$ Now for all j with $1 \leq j < p$, if $\forall i \ 1 \leq i \leq j$, $x_i = 0$, then we have $x_{j+1} = u'_{j+1,j+1} \cdot q_{j+1} \cdot N_{j+1}$, and similarly we can deduce that $x_{j+1}$ is also null.

Now let us assume that $U = U^{(2)} \cdot U^{(1)}$, where $U^{(1)}$ is a subdiagonal matrix with all elements integers and a diagonal of 1 or −1, and $U^{(2)}$ is a diagonal matrix whose for all i, $i^{th}$ diagonal element is primary with $N_i$.

Let us assume that for some $(q_1, \ldots, q_p)$ integers, and for some $(x_1, \ldots, x_p)$ in $[-N_1+1, N_1-1] \times \ldots \times [-N_p+1, N_p-1]$ we have:

$$U \cdot \begin{bmatrix} x_1 \\ \cdot \\ \cdot \\ \cdot \\ x_p \end{bmatrix} = \begin{bmatrix} q_1 \cdot N_1 \\ \cdot \\ \cdot \\ \cdot \\ q_p \cdot N_p \end{bmatrix}$$

Let us call $$\begin{bmatrix} y_1 \\ \cdot \\ \cdot \\ y_p \end{bmatrix} = U^{(1)} \cdot \begin{bmatrix} x_1 \\ \cdot \\ \cdot \\ x_p \end{bmatrix}$$

we have therefore:

$$U^{(2)} \cdot \begin{bmatrix} y_1 \\ \cdot \\ \cdot \\ y_p \end{bmatrix} = \begin{bmatrix} q_1 \cdot N_1 \\ \cdot \\ \cdot \\ q_p \cdot N_p \end{bmatrix}$$

That is to say:

$$\begin{bmatrix} u_{1,1}^{(2)} \cdot y_1 \\ \cdot \\ \cdot \\ u_{p,p}^{(2)} \cdot y_p \end{bmatrix} = \begin{bmatrix} q_1 \cdot N_1 \\ \cdot \\ \cdot \\ q_p \cdot N_p \end{bmatrix}$$

For all i from 1 to m, $N_i$ divides $u_{i,i}^{(2)} \cdot y_i$, and is primary with $u_{i,i}^{(2)}$ by definition of $U^{(2)}$, then, according to Gauss theorem, it also divides $y_i$. In other word we can find some $q_1', \ldots, q_p'$ integers such that:

$$\begin{bmatrix} y_1 \\ \cdot \\ \cdot \\ y_p \end{bmatrix} = \begin{bmatrix} q_1' \cdot N_1 \\ \cdot \\ \cdot \\ q_p' \cdot N_p \end{bmatrix}$$

that is to say:

$$U^{(1)} \cdot \begin{bmatrix} x_1 \\ \cdot \\ \cdot \\ x_p \end{bmatrix} = \begin{bmatrix} q_1' \cdot N_1 \\ \cdot \\ \cdot \\ q_p' \cdot N_p \end{bmatrix}$$

Now $U^{(1)}$ is a sub-diagonal matrix of integers with diagonal elements all equal to 1 or to −1. Then, as we have already shown it above, this in-volves that $$\begin{bmatrix} x_1 \\ \cdot \\ \cdot \\ x_p \end{bmatrix} = 0,$$

and since $(q_1, \ldots, q_p)$ were any integers, and $(x_1, \ldots, x_p)$ any elements of $[-N_1+1, N_1-1] \times \ldots \times [-N_p+1, N_p-1]$, this involves that $\phi_U$ is injective, and therefore bijective, thus concluding the proof.

Elementary Factor Merge $\phi_n$

In order to get back to $S^{(k)} = \boxed{N}$ in the end, some x product of sets must also sometimes be merged. The elementary factor merge $\phi_n$ function merges the two first factors of the first term of $S^{(n-1)}$. In fact the same principle could be used on any pair of factors of any term that have at least two factors, but this is not needed for the definition thanks to the term and factor permutation functions defined above.

In that case:

$q_n = q_{n-1}$, i.e. same number of terms $p_{1,n-1} \geq 2$ and $p_{1,n} = p_{1,n-1} - 1$ i.e. one factor fewer in first term $\forall i \in \{2, \ldots, q_n\} T_i^{(n)} = T_i^{(n-1)}$, i.e. terms other than the first one are unchanged $\forall j \in \{3, \ldots, p_{1,n-1}\} N_{1,j-1}^{(n)} = N_{1,j}^{(n-1)}$, i.e. the $p_{1,n-1} - 2$ last factors of $T_1^{(n-1)}$ are unaffected A and B defined by $A \triangleq N_{1,1}^{(n-1)}$, $B \triangleq N_{1,2}^{(n-1)}$, and thus $A \cdot B = N_{1,1}^{(n)}$ a bijection $$h: \boxed{A} \times \boxed{B} \rightarrow \boxed{A \cdot B}$$
$$(x_1, x_2) \mapsto h((x_1, x_2))$$

$\phi_n$ is built as:

$$\varphi_n: S^{(n-1)} \rightarrow S^{(n)}$$
$$x \mapsto \begin{cases} (1, (h(x_1, x_2), x_3 \ldots, x_{p_{1,n-1}})) & \text{if } t = 1 \\ x & \text{otherwise} \end{cases}$$

with $x = (t, v)$ and $v = $ $(x_1, x_2 \ldots x_{p_{t,n-1}})$

The h bijections used by the elementary merge function can be defined as follows:

$h: \boxed{A} \times \boxed{B} \rightarrow \boxed{A \cdot B}$ MAIN FACTOR MERGE FUNCTIONS There are many possible functions that all are computable on any current processor.

Here is one example:

In the following for all x and y integer such that y>0:

x div y stands for the quotient of Euclidian division of x by y, x mod y stands for the remainder of Euclidian division of x by y.

Note that $\forall x \forall y \, y > 0$, $(x \bmod y) \in \boxed{y}$, even for $x \leq 0$ The DIV-MOD factor merge function:

$$h: \boxed{A} \times \boxed{B} \rightarrow \boxed{A \cdot B}$$
$$(x_1, x_2) \mapsto B \cdot x_1 + x_2$$

This function is clearly bijective and its inverse function is the div-mod factor split g bijection exemplified in the definition of the elementary factor split $\phi_n$ function:

Note: it is not needed to define a mod-mod factor merge h function that would be the inverse of the mod-mod factor split g function defined for the elementary factor split $\phi_n$, that is to say:

$g(x)=(x \bmod A, x \bmod B)$ $g^{-1}((a,b))=b+(((a-b)\cdot B') \bmod A)\cdot B$ As a matter of fact the $\phi_n$ that would result from this mod-mod factor merge h would be the composition of an affine-mod $\phi_n$ of matrix defined by block:

$$U = \begin{bmatrix} \overbrace{\begin{array}{c|c} Id & O_V \\ \hline O_H & \begin{array}{cc} B' & 0 \\ 0 & 1 \end{array} \end{array}}^{U^{(2)}} \end{bmatrix} \cdot \begin{bmatrix} \overbrace{\begin{array}{c|c} Id & O_V \\ \hline O_H & \begin{array}{cc} 1 & -1 \\ 0 & 1 \end{array} \end{array}}^{U^{(1)}} \end{bmatrix}$$

and of null vector V, and of the elementary factor merge function using the div-mod factor merge h function.

Above Id, $O_V$, and $O_H$ are respectively the identity (m−2)×(m−2) matrix (diagonal of 1), the null (m−2)×2 matrix and the null 2×(m−2) matrix.

Elementary Term Merge $\phi_n$

In order to get back to $\boxed{N}$ in the end, some $\uplus$ sum of sets must also sometimes be merged. The elementary term merge $\phi_n$ function merges the two first factors respectively of the two first terms of $S^{(n-1)}$, when the two first terms have the same subsequent factors, that can therefore be factorised. In fact the same principle could be used on any pair of factor of any pair of terms in $S^{(n-1)}$, provided that they can be factorised in the form $(\boxed{A} \oplus \boxed{B}) \times \boxed{A_1} \times \ldots \times \boxed{A_p}$.

In that case:

$q_{n-1} \geq 2$ and $q_n = q_{n-1} - 1$, i.e. one fewer term $\forall j \in \{3, \ldots, p_{n-1}\} T_{j-1}^{(n)} = T_j^{(n-1)}$, i.e. remaining terms unchanged $p_{1,n-1} = p_{2,n-1} = p_{1,n}$, i.e. the two first terms of $S^{(n-1)}$ have the same number of factors, that is also that of the first term of $S^{(n)}$ $\forall j \in \{2, \ldots, p_{1,n-1}\} N_{1,j}^{(n-1)} = N_{2,j}^{(n-1)}$, that is to say the two first term can be factorised A and B defined by $A \triangleq N_{1,1}^{(n-1)}$, $B \triangleq N_{2,1}^{(n-1)}$, and thus $A+B = N_{1,1}^{(n)}$ a bijection $\kappa: \boxed{A} \oplus \boxed{B} \to \boxed{A+B}$ $\varphi_n$ is built as:

$\varphi_n: S^{(n-1)} \to S^{(n)}$ $x \mapsto \begin{cases} (1, \kappa((t, x_1))), & \text{if } t = 1 \text{ or} \\ x_2, \ldots, x_{p_{1,n-1}}) & t = 2 \\ (t-1, v) & \text{otherwise} \end{cases}$ With $x = (t, v)$ and $v = (x_1, x_2 \ldots x_{p_{t,n-1}})$ The term merge $\kappa$ bijections used by the elementary term merge function can be defined as follows:

$\kappa: \boxed{A} \oplus \boxed{B} \to \boxed{A+B}$ MAIN TERM MERGE FUNCTIONS

There are many possible functions that all are computable on any current processor.

As an example of $\kappa$, the mod-threshold term merge function will be described hereafter:

In this function, a merge function is made that is the inverse of the mod-threshold term split function that was already explained.

Similarly we have two constants C and T such that:

$\kappa: \boxed{A} \oplus \boxed{B} \to \boxed{A+B}$ $(t, v) \mapsto x$ defined by the algorithm below Three constants $x_M$, $v_M$ and $t_M$ are derived from A, B and C according to the following definitions and formulas (the formulas are the same as for the mod-threshold term splitting function):

$x_M$ is the greatest x while neither $\boxed{A}$ nor $\boxed{B}$ are empty.

$t_M$ is the tag of the set ($\boxed{A}$ or $\boxed{B}$) not yet empty.

$v_M$ is the greatest value of the set not yet empty while both sets are not yet empty.

$$X_M \triangleq \max \left\{ x \in \boxed{A+B} \middle/ \begin{array}{l} l \cdot T + c < A \quad \text{if } c < T \\ \text{and} \\ l \cdot (C-T) + c - T < B \quad \text{otherwise} \end{array} \right., \text{ where } l = x \text{ div } C, \text{ and } c = x \bmod C \right\}$$

$$t_M \triangleq \begin{cases} 1 & \text{if } ((x_M + 1) \bmod C) \geq T \\ 2 & \text{otherwise} \end{cases}$$

$$v_M \triangleq \begin{cases} \max\left\{ v / \exists x \leq x_M, \begin{array}{l} l \triangleq x \text{ div } C \\ \text{and} \\ c \triangleq x \bmod C \end{array} \Rightarrow \begin{array}{l} c < T \\ \text{and} \\ v = l \cdot T + c \end{array} \right\} & \text{if } t_M = 1 \\ \max\left\{ v / \exists x \leq x_M, \begin{array}{l} l \triangleq x \text{ div } C \\ \text{and} \\ c \triangleq x \bmod C \end{array} \Rightarrow \begin{array}{l} c \geq T \\ \text{and} \\ v = l \cdot (C-T) + c - T \end{array} \right\} & \text{if } t_M = 2 \end{cases}$$

Then the algorithm that maps (t,v) onto x is the following:

```
if v ≤ v_M or t ≠ t_M then
begin
    remark Neither [A] nor [B] are yet empty, then discrimination is
    based on tag
    if t = 1 then
        x := (v div T)·C + (v mod T);
    else
        x := T + (v div (C − T))·C + (v mod (C − T));
    end
else
begin
    remark [A] or [B] is already empty, then no more discrimination
    the remainder of the set not yet empty is mapped to [A + B]
    x := v − v_M + x_M;
```

Implementation Matters

In fact the method of the invention is not tied to any particular implementation scheme. The method only defines mathematically a permutation, with a definition allowing less tabulation at the expense of more processing.

As was already suggested above, the computation of $I^{-1}$ from its $\phi_k°\phi_{k-1} \ldots °\phi_1$ definition might be done by-a general purpose processor, typically during connection time, in order to prepare a look-up table to be used during interleaving. But as well, this computation might also be done by dedicated hardware circuitry, computing on the fly $I^{-1}(i)$ from its $\phi_k°\phi_{k-1} \ldots °\phi_1$ definition in order to interleave the $(i+1)^{th}$ symbol of data when this symbol is to be interleaved. Typically a hardware circuitry could use a pipeline architecture where each step in the pipeline more or less correspond to one $\phi_n$, or one compound $\phi_{n+p}° \ldots °\phi_n$. This kind of architecture is applicable because in order to compute on the fly $I^{-1}(i)$, what matters is not the total computation time of $I^{-1}(i)$, but the rate at which they can be computed. This is because the "i" arguments of $I^{-1}(i)$ come in a predefined order.

When a hardware architecture is used, the operations implemented are not necessarily using the mathematical definition of $\phi_n$. In order to reduce the circuit size, there can be a mixture of arithmetic units, and of ROM tables. For instance a first x splitting step can be done arithmetically, then the intermediate steps can be done by look up table, and a final x merging step can be done arithmetically again.

When a general purpose processor is used, neither are the operations implemented necessarily directly using the mathematical definition of $\phi_n$. There might be some optimisations:

For instance when N is a power of 2, then splitting [N] into a product of sets whose respective element numbers are also power of two does not need any division or modulo computation since it can be done by simple bit manipulation such as ORs, ANDs and bit shifts. For instance when mapping [256] to [8] × [32] by the div-mod factor split function, then the image of x is (y,z), where if x=b7b6b5b4b3b2b1b0 in binary notation, then y=b7b6b5 and z=b4b3b2b1b0. To take it in more practical terms, if x=10110001, then y=101 and z=10001.

Also still in the case of a number N of elements that is a power of two, and when there is only one term (or when only one term of size N in the ⊎ sum is considered), some factor permutations are implementable by classical processing units instructions such as bit rotation or quartet swap. Let us for instance consider for N=256 the 16×16 rectangular interleaver. The 16×16 rectangular intedeaver comprises in its $\phi_n$ compound definition a factor permutation that is swapping the two [16] factors. In fact, the interleaver permutation can be shown to be not much more than a quartet swap which can be done in one instruction on some processing machines.

Non-uniqueness of Definition

The inventive method provides means to define an interleaver using less tabulation at the expense of more processing, so that to reduce ROM size requirement.

The definition of the interleaver provided by the method might be not unique, since for instance:

consecutive splitting steps can sometimes be done in several different ways; for instance a first way to map [140] onto [7] × [4] × [5] is a first divmod splitting function $\phi_1$ mapping [140] onto [7] × [20] followed by a second div-mod split $\phi_4°\phi_3°\phi_2$ mapping [20] onto [4] × [5] ($\phi_2$ and $\phi_4$ are the factor permutation function respectively bringing [20] in first position, and then [7] in first position again); a second way is a first div-mod splitting function $\phi'_1$ mapping [140] onto [28] × [5], followed by a second div-mod split $\phi'_2$ mapping [28] onto [7] × [4]; both ways yield the same mapping ($\phi_4°\phi_3°\phi_2°\phi_1=\phi'_2°\phi'_1$), the order of compound of two functions whose action is limited to different factor or terms can be inverted, it is possible to build a function $\phi_n$ and its inverse by the inventive method, then you can always insert a compound of several $\phi_n$ into the compound defining $I^{-1}$, provided that the compound of these several $\phi_n$ sums up to the identical function, and has no overall effect, for instance when $I^{-1}=\phi_k° \ldots °\phi_2°\phi_1$ is an interleaver over [N], and N=L·C, then if $\phi_{k+1}$ is defined as the div-mod factor split function that map [N] to [L] × [C] and $\phi_{k+2}$ as the div-mod factor merge function that maps [L] × [C] to [N], then $I^{-1}$ can also be defined as $I^{-1}=\phi_{k+2}°\phi_{k+1}°\phi_k° \ldots °\phi_2°\phi_1$ because the compound $\phi_{k+2}°\phi_{k+1}$ has no overall effect.

the classification of the $\phi_n$ might not be unique, some $\phi_n$ can be found under two categories. For instance when all the $N_{1,j}^{(n)}$ are equal then a "factor permutation" $\phi_n$ can also be defined as an "affine-mod" $\phi_n$ with V=0 and U a permutation matrix.

Example of Inventive Method Applied to Known Interleavers

The inventive method allows to build interleavers by mixing tabulation (or processing not defined in the invention) and processing (defined in the invention). Here is shown that some well known interleavers can be defined with the inventive method to be implemented in an interleaver device according to the invention.

1—The Rectangular Interleaver

According to the invention, the classical rectangular interleaver I of depth N=L·C with L lines and C column block is written as:

$$I^{-1}=\phi_3°\phi_2°\phi_1$$

Where:

$\phi_1$ is the div-mod elementary factor split function splitting [N] to [L] × [C]

Figure 6:
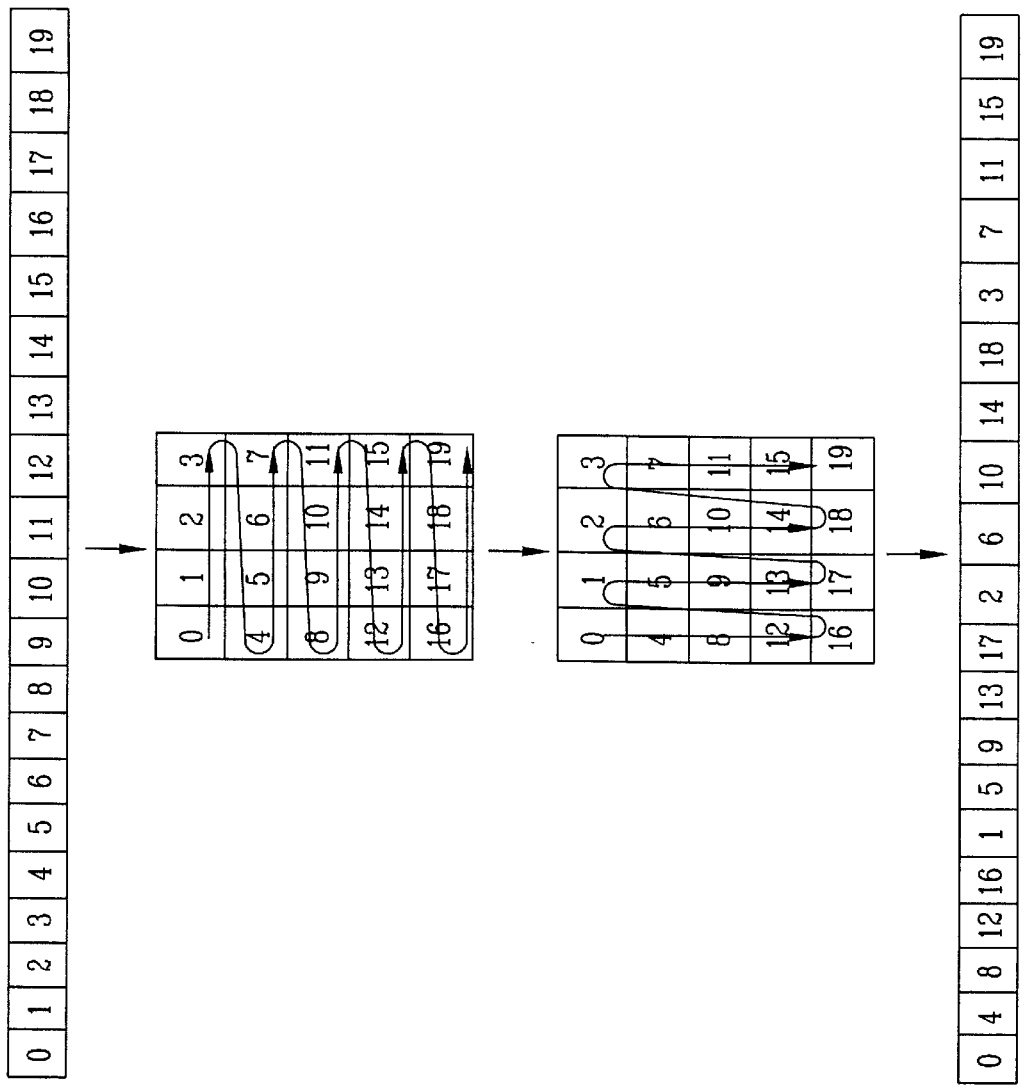
FIG. 6 is an illustration of a rectangular interleaver applied to a data set.

$\phi_2$ is the factor permutation function for $\sigma=(2,1)$, that is to say $\phi_2$ is mapping $[L] \times [C]$ on $[C] \times [L]$ $\phi_3$ is the div-mod elementary factor merge function merging $[C] \times [L]$ to $[N]$ The rectangular interleaver is illustrated on FIG. 6.

2—The Diagonal Interleaver

The usual diagonal interleaver I depth $N=L\cdot C$, with L lines and C column block, where lines are written first and then diagonal are read, when $j^{th}$ diagonal begins at the first element of $j^{th}$ line is written as:

$$I^{-1}=\phi_3{}^\circ\phi_2{}^\circ\phi_1$$

Where:

$\phi_1$ is the div-mod elementary factor split function splitting $[N]$ to $[L] \times [C]$ $\phi_2$ is the affine-mod function with V=0 and $$U = \begin{bmatrix} 1 & 1 \\ 0 & 1 \end{bmatrix}$$

$\phi_3$ is the div-mod elementary factor merge function merging $[L] \times [C]$ to $[N]$ 3—The Truncated Rectangular Interleaver Truncated rectangular interleavers are used in MIL interleavers which are defined in ETSI SMG2 UMTS-L1 EG Tdoc 98/273 "Multi-stage interleaving (MIL) method for Turbo codes" by "NTT DoCoMo". In a truncated rectangular interleaver the N input data is written along lines in a block of L' lines and C' columns, with C' which is not a divider of N (and L' great enough for $L'\cdot C' \geq N$). Then the data is read out along columns.

Figures 7, 8:
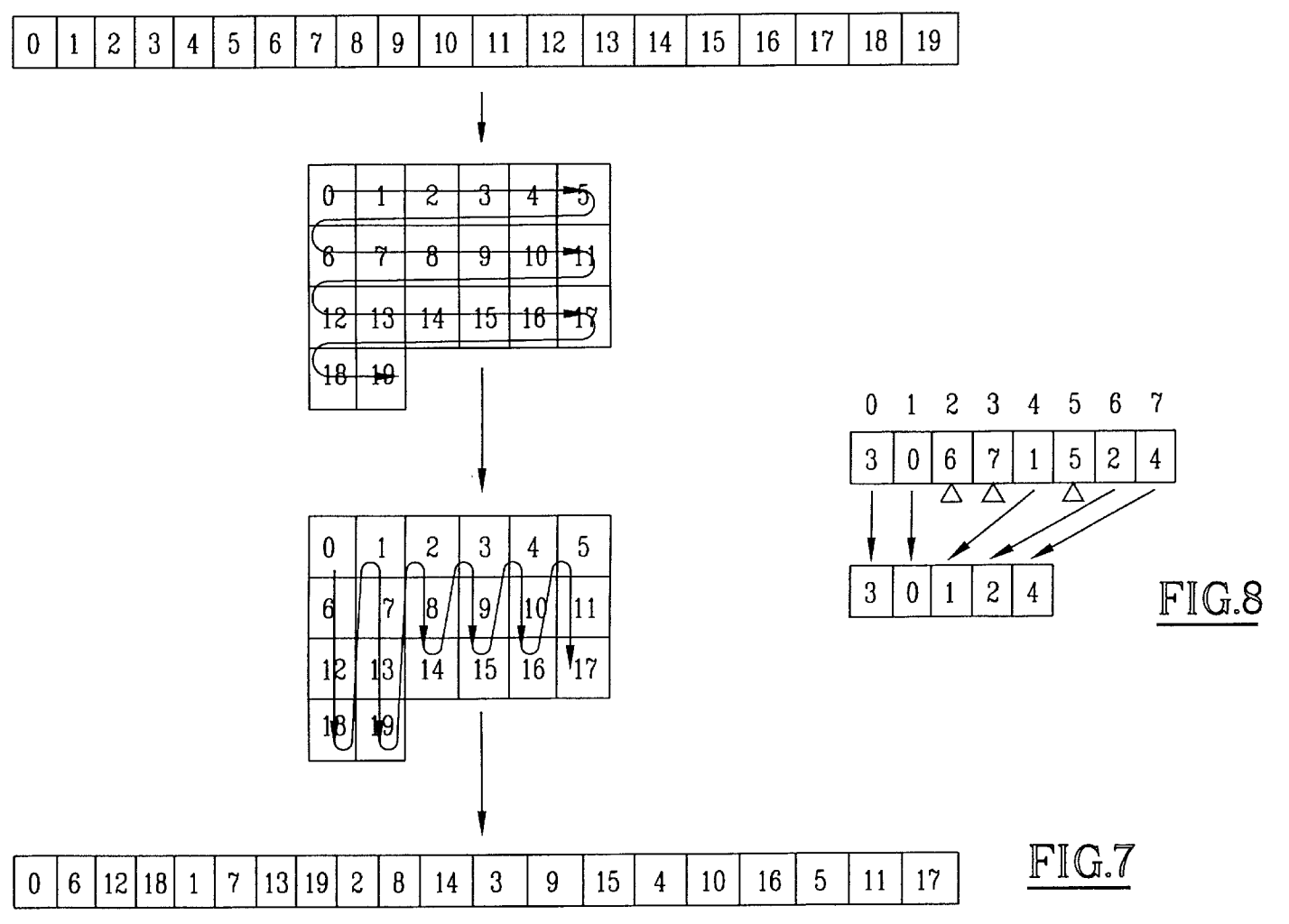

The truncated rectangular interleaver is illustrated on FIG. 7 with N=20 and C'=6.

The truncated rectangular interleaver is defined by the method of the invention as the $\uplus$ sum of two rectangular interleavers.

$$I^{-1}=\phi_8{}^\circ(\phi_7{}^\circ\phi_6{}^\circ\phi_5){}^\circ(\phi_4{}^\circ\phi_3{}^\circ\phi_2){}^\circ\phi_1$$

Where:

$\phi_1$ is the mod-threshold elementary term split function, where C=C' and T=N mod C'.

$\phi_1$ $[N]$ to $[N_1] \uplus [N_2]$ with $N_1 = (N \text{ div } C'+1)\cdot(N \text{ mod } C')$, and $N_2 = (N \text{ div } C')\cdot(C'-(N \text{ mod } C'))$ $(\phi_4{}^\circ\phi_3{}^\circ{}'\phi_2)$ is the first rectangular interleaver that is applied to $[N_1]$ with parameters:

$L = (N \text{ div } C'+1)$, and $C = (N \text{ mod } C')$ $(\phi_7{}^\circ\phi_6{}^\circ\phi_5)$ is the second rectangular interleaver that is applied to $[N_2]$ with parameters:

$L = (N \text{ div } C')$, and $C = C'-(N \text{ mod } C')$ $\phi_8$ is the term merge function with $C=N_1+N_2$ and $T=N_1$.

4—The Mil Interleaver

The MIL interleavers defined in ETSI SMG2 UMTS-L1 EG T doc 98/273 "Multi-stage interleaving (MIL) method for Turbo codes" by "NTT Do-CoMo" can also be constructed by the method of the invention. The MIL interleaver is defined recursively, and the method of the invention is by essence recursive.

A MIL interleaver of depth $N=L\cdot C$ is defined as the succession of the following steps:

1) First write the input data along the lines of the rectangular block of L lines and C columns;
2) Then interleave each line by either a rectangular interleaver, or a trunctated rectangular interdaver, or a MIL interleaver; and
3) Finally read the block by columns.

The first step consists of $(\phi_2{}^\circ\phi_1)$, where $\phi_1$ is the div-mod factor split function applied to $[N]$ and mapping it to $[L] \times [C]$ and $\phi_2$ is the distribution function that maps $[N]$ where each term consists of a line of the block.

The second steps consists in applying a rectangular, a truncated rectangular or a MIL interleaver to each term. As already seen, rectangular and truncated rectangular intedeaver can be generated by the method of the invention, then this second step is also within the invention.

The third step consisting of reading the block by column can be simply written as $(\phi_k{}^\circ\phi_{k-1}{}^\circ\phi_{k-2})$, where $\phi_{k-2}$ is the factorisation function mapping $$\underbrace{[C] \oplus \ldots \oplus [C]}_{L \text{ times}} \text{ to } [L] \times [C].$$

$\phi_{k-1}$ a factor permutation mapping $[L] \times [C]$ to $[C] \times [L]$, and $\phi_k$ the div-mod factor merge.

In conclusion MIL interleavers are a subset of the interleavers that can be generated by the inventive method.

5—Other Interleavers

The inventive method is open to embed other interleavers into the inventive interleavers by means of the elementary interleaving function. After decomposing $S^{(0)}=[N]$ into a sum of products of sets of the $[x]$ form, an interleaver not defined by this document can be applied to only one of this factor set: this is what is called elementary interleaving in this document.

In the definition of many existing intedeaver a similar method is also used, for instance in ETSI SMG2 UMTS-L1 EG Tdoc 98/337 "A General Turbo Interleaver Design Technique with Near Optimal Performance" by "Hughes Network Systems", we can read that such a process is used:

writing the symbol in a rectangular block along the rows: this corresponds to a div-mod factor split of $[N]$ to $[L] \times [C]$ then operating on each row separately: this corresponds to a distribution of $[L] \times [C]$ product in a sum of L terms $[C] \uplus \ldots \uplus [C]$ each term being a row, shuffling each row by some rule derived from Galois field arithmetic: this corresponds to an elementary interleaving applied to the term of which the row is consisting.

permutating the rows: this can be expressed either as a term permutation, or as factorising to $[L] \times [C]$ again, and making an elementary interleaving bearing on the $[L]$ dimension.

reading by column: this is also interpreted in the inventive method, we first swap the two factors in $[L] \times [C]$ by a factor permutation, then make a div-mod factor merge.

The invention brings some methodology allowing to define an interleaver in a unified formal language. This would ease specification of interleavers by defining the compound or sequence of the $\phi_n$. Such a specification would be without ambiguity, and even possibly in a language that is directly machine processable. Such a sequence can be coded in a dedicated binary format, for instance a TLV format, where T (tag) gives the type of $\phi_n$ (factor split, term split, affine-mod, etc.) and the LV (length+value) gives the characteristics of $\phi_n$, for instance if $\phi_n$ is affine-mod, the matrix U and the vector V. Such a coded format can be used to defined a great variety of interleavers in a device at a very low ROM memory cost. Also the same format can be used on an interface to negotiate which interleaver is to be used.

The term split is also of a great interest. Many arithmetic interleavers (e.g. GF interleaver as defined in ETSI SMG2 UMTS-L1 EG Tdoc 98/337 "A General Turbo Interleaver Design Technique with Near Optimal Performance" by "Hughes Network Systems", for $N=2^m$) are primarily defined for some N that has good properties. When an interleaver with an N that has not such good properties needs to be built, then an arithmetic interleaver with N'>N and N' having the good properties is built, and then punctured down to N. Puncturing an interleaver is not done at a very high processing power when it consists in modifying a RAM table. However these forces an implementation where first the interleaver is prepared in a RAM table, and then this RAM table is used. Implementation where the interleaver function is computed real time by an ASICs cannot be realistically considered with puncturing. Thanks to the term splitting function instead of searching for N' with good arithmetic properties and N'>N, one can find N' with good arithmetic properties such that N'<N, and then apply the arithmetic interleaver to a term of size N', thus avoiding any puncturing.

Puncturing of an interleaver is shown on FIG. 8. An interleaver $I_8$ of depth 8 is punctured down to a depth of 5 to form an interleaver $I_5$. In the upper part of the figure a table where the values of $I_8^{-1}$ are shown. The table entry number (above the table) is the value of i, and the entry value (inside the table) is the value of $I_8^{-1}(i)$. In other words we have $I_8^{-1}(0)=3$, $I_8^{-1}(1)=0$, etc. Then all the entries such that $I_8^{-1}(i) \geq 5$ are to be punctured. These entries are marked on the figure by a triangle. Puncturing consists in moving some part of the table, for instance the entry in position 4 is moved to position 2 so that $I_5(2)=I_8(4)=1$.

After puncturing, the 5 first entries of the table contain only numbers ranging from 0 to 4.

What is claimed is:

1. An interleaver device configured to interleave a data set, comprising:
    an interleaver driver;
    a processing unit including a data processor configured to operate as an interleaver under the control of the interleaver driver;
    a data input device configured to input the data set to be interleaved; and
    a data output device configured to output an interleaved data set, said interleaver driver including,
        a mapping processor configured to calculate a set of bijective elementary functions ($\phi_n$) and supply a mapping of the interleaver to the data processor, and
        an interleaver definition generator configured to supply an interleaver definition to said mapping processor, said interleaver definition comprising a compound function ($\phi_k O \ldots o \phi_1$) of at least one bijective elementary function drawn from said set of bijective elementary functions ($\phi_n$).

2. The interleaver device according to claim 1, said interleaver driver comprising:
    a read only memory (22) configured to supply a plurality of parameters corresponding to said set of the bijective elementary functions ($\phi_n$) to said mapping processor.

3. The interleaver device according to claim 1, said interleaver definition generator comprising:
    an interleaver definition input module.

4. The interleaver device according to claim 1, said set of bijective elementary fiunctions ($\phi_n$) comprising:
    a plurality of functions having an origin set and a destination set each expressed as a sum of a product of factor sets of successive integers, said plurality of functions including,
        an elementary term split function configured to split a factor of a term of said set of bijective elementary functions ($\phi_n$) into a sum of two sets;
        an elementary factor split function configured to split said factor of said term of said set of bijective elementary functions ($\phi_n$) into a product of two sets;
        an elementary permuting function configured to permute elements of said a factor of said term of said set of bijective elementary functions ($\phi_n$);
        an elementary affine-mod function configured to affine map said term of said set of bijective elementary functions ($\phi_n$) as a subset of vector space with a vector dimension equal to a predetermined number of factors and to select a modulus of a coordinate corresponding to a size of a respective factor set;
        an elementary factor merge function configured to merge two factors of said term so as to merge a product of sets into an elementary factor merged set; and
        an elementary term merge function configured to merge two factors respectively of two terms of said set of bijective elementary functions ($\phi_n$) so as to merge a sum of sets into an elementary term merged set, said two terms selected to have common factors.

5. The interleaver device according to claim 4, said plurality of functions further comprising:
    a elementary term permutation function; and
    a elementary factor permutation function, wherein
        said elementary term split function is configured to split a first factor of a first term of said set of bijective elementary functions ($\phi_n$) into a sum of two sets;
        said elementary factor split function is configured to split said first factor of said first term of said set of bijective elementary functions ($\phi_n$) into a product of two sets;
        said elementary permuting function is configured to permute elements of said first factor of said first term of said set of bijective elementary functions ($\phi_n$);
        said elementary factor merge function is configured to merge the said first factor and a second factor of the first term of said set of bijective elementary functions ($\phi_n$); and
        said elementary term merge function is configured to merge the two first factors respectively of the two first terms of said set of bijective elementary functions ($\phi_n$), said two first terms selected to have common subsequent factors.

6. The interleaver device according to claim 4, wherein
said elementary factor split function is configured to split
one factor $\boxed{A \cdot B}$ of a term in said set of bijective
elementary functions ($\phi_n$) with a first mapping of
$\boxed{A \cdot B} \to \boxed{A} \times \boxed{B}$ and a second mapping of $x \to (x \text{ div } B, x \text{ mod } B)$.

7. The interleaver device according to claim 4, wherein
said elementary factor split function is configured to split
one factor $\boxed{A \cdot B}$ of a term in said set of bijective
elementary functions ($\phi_n$) with a first mapping of
$\boxed{A \cdot B} \to \boxed{A} \times \boxed{B}$ and a second mapping of $x \to (x \text{ div } B, x \text{ mod } B)$.

8. The interleaver device according to claim 4, wherein
said elementary factor merge function is configured to
merge two factor $\boxed{A}$ and $\boxed{B}$ of a term in said set of
bijective elementary ftmnctions ($\phi_n$) with a first mapping of $\boxed{A \cdot B} \to \boxed{A} \times \boxed{B}$ and a second mapping of
$(x_1, x_2) \to B \cdot x_1 + x_2$.

9. The interleaver device according to claim 4, wherein
said elementary affine-mod function corresponds to an
affine function of matrix U equal to aproduct $U = U^{(2)} \cdot U^{(1)}$ of a first matrix $U^{(1)} = [u^{(1)}]$ and a second matrix
$U^{(2)} = [u^{(2)}]$, wherein
said first matrix $U^{(1)}$ is equal to a sub-diagonal matrix
with a diagonal of 1 or −1

$$\begin{cases} \forall (i,j) \in \{1, \ldots, m\}^2, j > i \Rightarrow u_{i,j}^{(1)} = 0 \\ \text{and} \\ \forall i \in \{1, \ldots, m\}, u_{i,i}^{(1)} = 1 \text{ or } u_{i,i}^{(1)} = -1, \text{ and} \end{cases}$$

said second matrix $U^{(2)}$ is equal to a diagonal matrix
with for all j $$\begin{cases} \forall (r,c) \in \{1, \ldots, m\}^2, r \neq c \Rightarrow u_{r,c}^{(2)} = 0 \\ \text{and} \\ \forall j \in \{1, \ldots, m\}, u_{j,j}^{(2)} \text{ and } N_{i,j}^{(n)} \text{ greatest common divider is 1.} \end{cases}$$

10. The interleaver device according to claim 4, wherein
said elementary term split function is configured to split
a first facto $\boxed{A+B}$ into $\boxed{A} \oplus \boxed{B}$ with a tag of an image
selected based on a comparison of a modulus of a
subset of input values of said first factor $\boxed{A+B}$ to a
constant threshold.

11. The interleaver device according to claim 4, wherein
said elementary term merge function is configured to
merge two factors $\boxed{A}$ and $\boxed{B}$ into a merged factor
$\boxed{A+B}$, said two factors $\boxed{A}$ and $\boxed{B}$ selected such in
accordance with a tag of an image tag corresponding to
said two factorts $\boxed{A} \oplus \boxed{B}$, selected by an inverse bijection function based on a comparison of a modulus of a
subset of input values of a first factor of said merged
factor $\boxed{A+B}$ to a constant threshold.

12. A method for interleaving a data set, comprising steps
of:
deriving a subset of bijective elementary functions ($\phi_n$)
from a predetermined set of bijective elementary functions ($\phi_n$);
compounding said subset of bijective elementary functions ($\phi_n$) so as to produce a set of compounded
bijective elementary functions; and
interleaving said set of compounded bijective elementary
functions in accordance with a predetermined interleaver definition ($I^{-1}$).

* * * * *